(12) United States Patent
Nishimura

(10) Patent No.: US 7,751,029 B2
(45) Date of Patent: Jul. 6, 2010

(54) LOAD-LOCK APPARATUS, DEVICE MANUFACTURING APPARATUS, AND DEVICE MANUFACTURING METHOD

(75) Inventor: Naosuke Nishimura, Kawachi-gun (JP)

(73) Assignee: Canon Kabushiki Kaisha, Tokyo (JP)

( * ) Notice: Subject to any disclaimer, the term of this patent is extended or adjusted under 35 U.S.C. 154(b) by 549 days.

(21) Appl. No.: 11/560,978

(22) Filed: Nov. 17, 2006

(65) Prior Publication Data

US 2007/0115446 A1    May 24, 2007

(30) Foreign Application Priority Data

Nov. 22, 2005    (JP)    ............................. 2005-337496

(51) Int. Cl.
*G03B 27/42*    (2006.01)
(52) U.S. Cl. ........................................ 355/53; 438/149
(58) Field of Classification Search .................... 355/53; 414/217
See application file for complete search history.

(56) References Cited

U.S. PATENT DOCUMENTS 6,742,977 B1 *    6/2004    Okayama et al. ............ 414/217
2004/0187452 A1 *    9/2004    Edo ............................ 55/385.2
2004/0187792 A1 *    9/2004    Parks ........................... 118/733
2005/0186716 A1 *    8/2005    Kasumi ........................ 438/149

FOREIGN PATENT DOCUMENTS

JP    2003-086668    3/2003

* cited by examiner

*Primary Examiner*—Edward J. Glick
*Assistant Examiner*—Mesfin T Asfaw
(74) *Attorney, Agent, or Firm*—Fitzpatrick, Cella, Harper & Scinto

(57) ABSTRACT

A load-lock apparatus includes a housing having a movable member, a first opening to allow a load-lock chamber to communicate with a processing chamber and a second opening, different from the first opening. The housing defines a volume of the load-lock chamber. A driving mechanism drives the movable member. A first gate valve is provided at the first opening, a second gate valve is provided at the second opening, and a pump reduces a pressure in the load-lock chamber. The driving mechanism drives the movable member, after loading an object into the load-lock chamber and before unloading the object from the load-lock chamber, to change the volume of the load-lock chamber. The driving mechanism decreases the volume of the load-lock chamber after the object is loaded into the load-lock chamber through the second gate valve and before the second gate valve is closed, and the pump reduces the pressure in the load-lock chamber after the volume of the load-lock chamber is decreased and the second gate valve is closed.

1 Claim, 12 Drawing Sheets

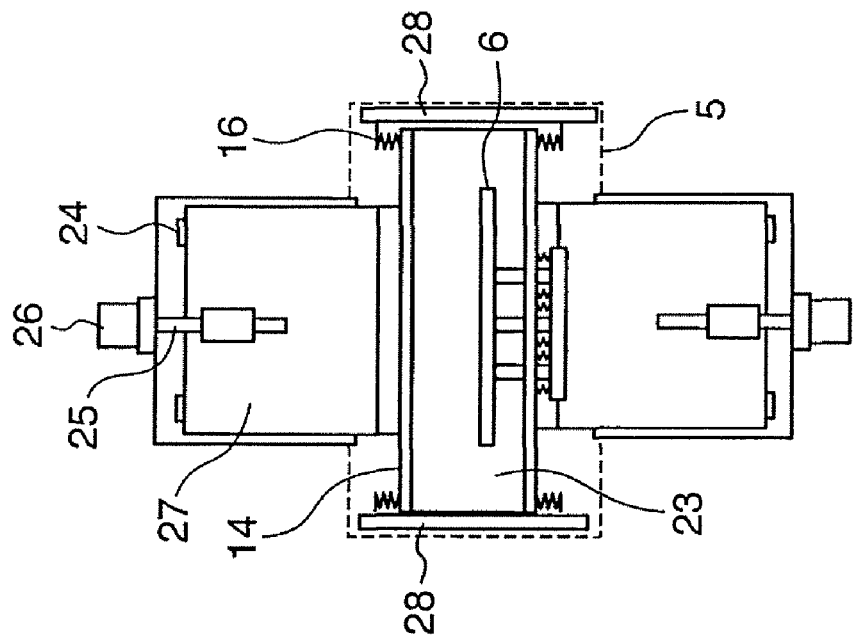
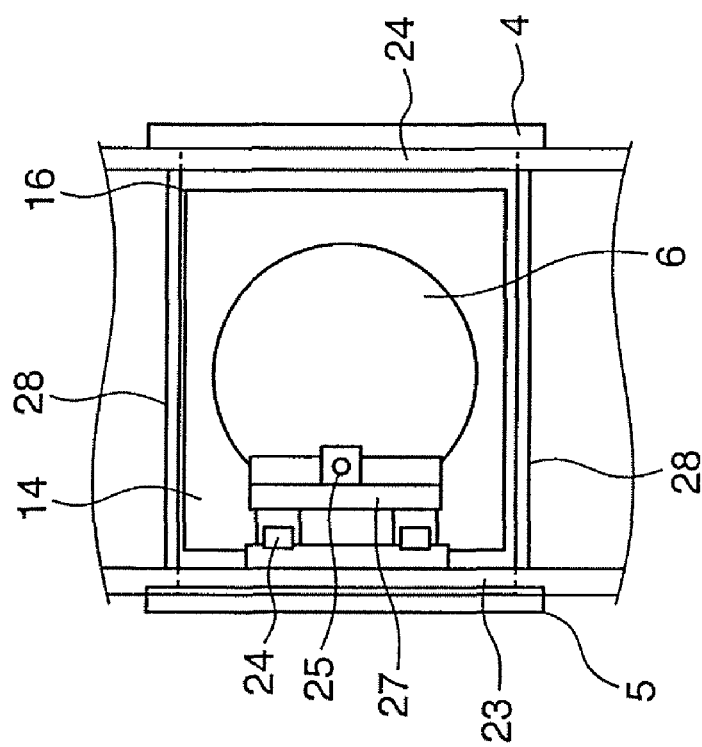
FIG. 2B
FIG. 2A

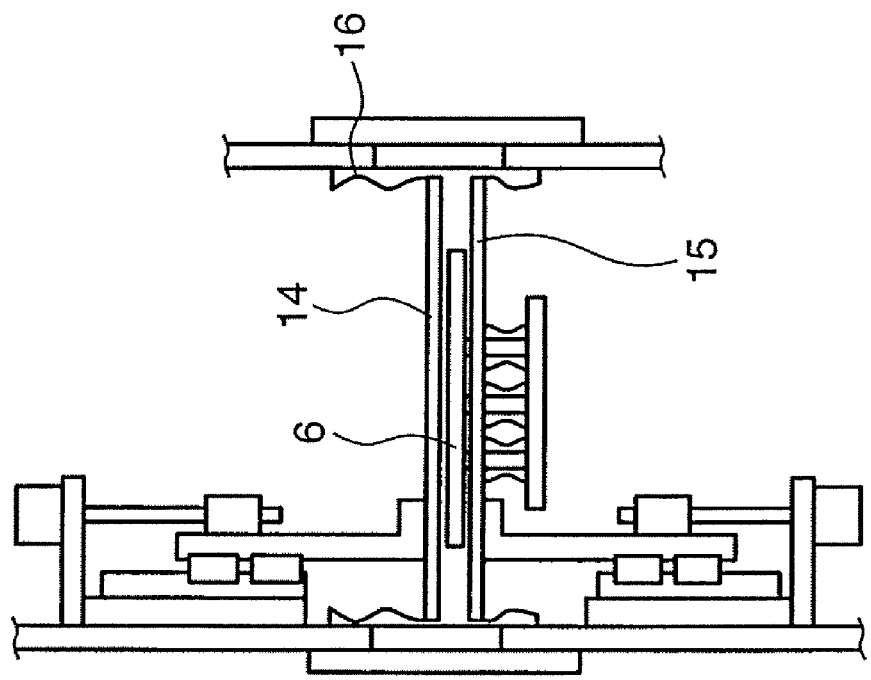
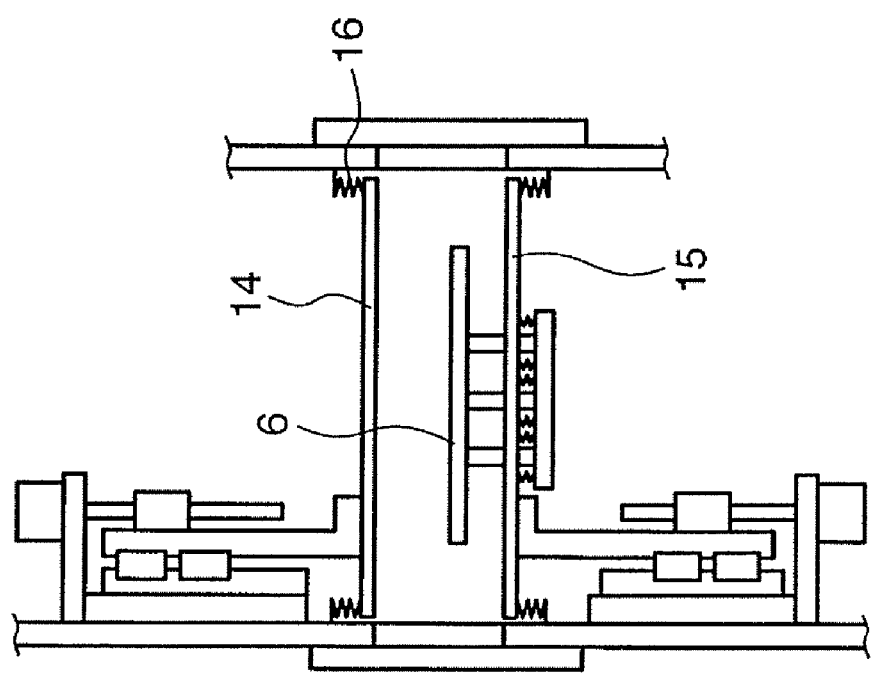
FIG. 3B
FIG. 3A

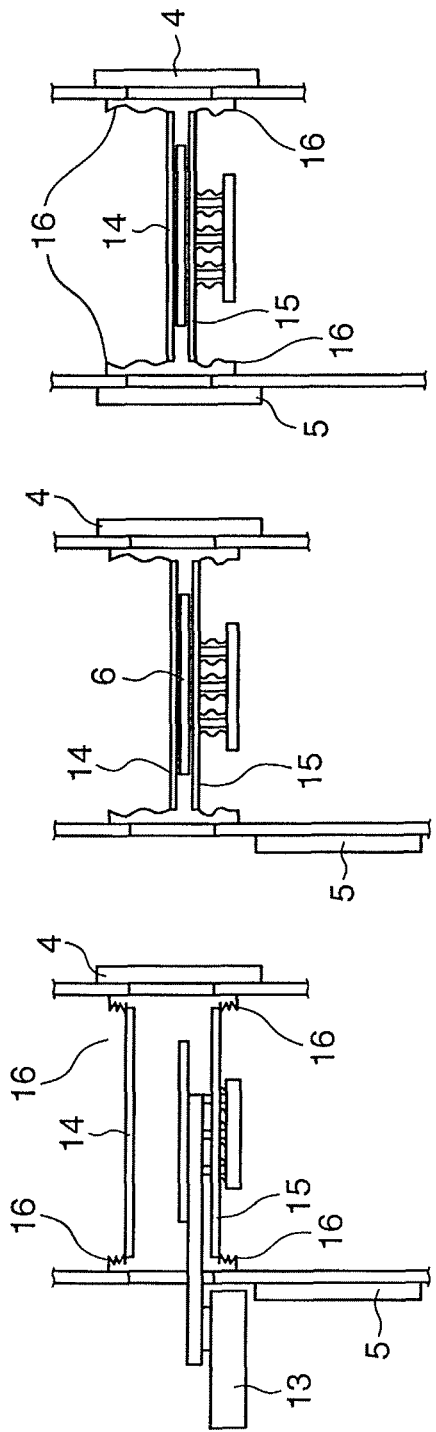
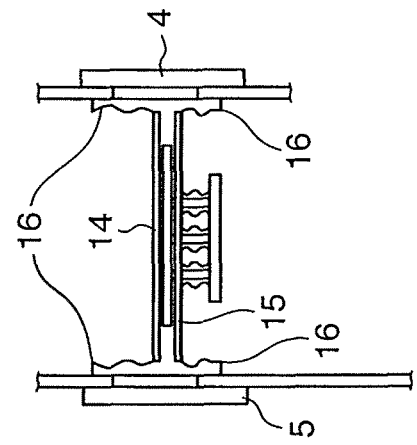
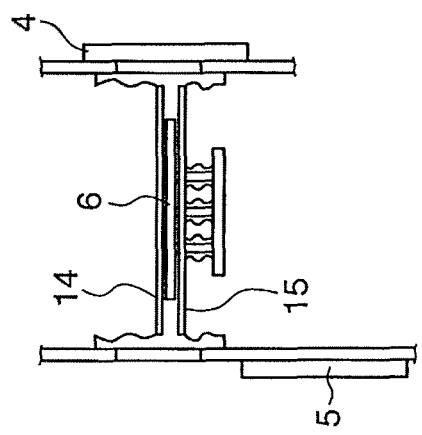
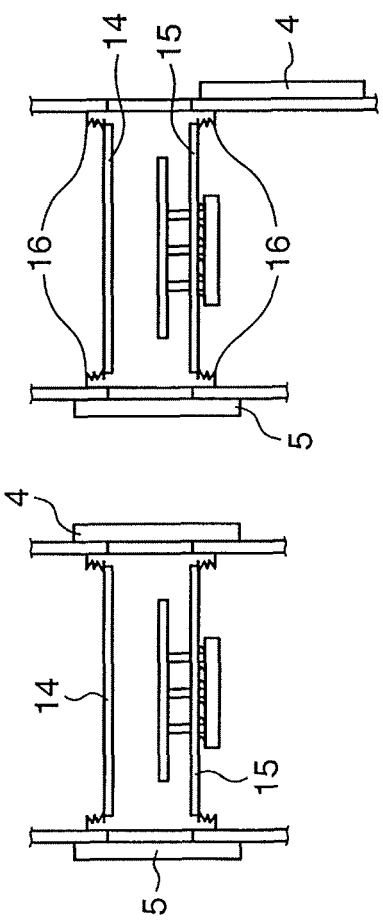
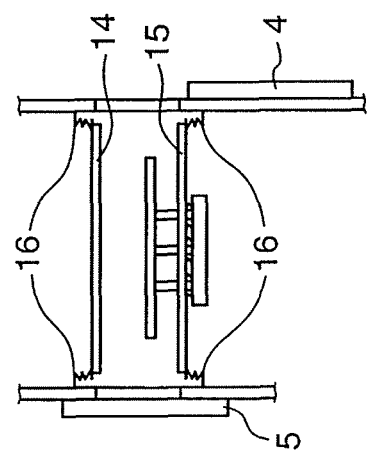

LOAD-LOCK APPARATUS, DEVICE MANUFACTURING APPARATUS, AND DEVICE MANUFACTURING METHOD

This application claims the benefit of Japanese Patent Application No. 2005-337496, filed on Nov. 22, 2005, which is hereby incorporated by reference herein in its entirety.

BACKGROUND OF THE INVENTION

1. Field of the Invention

The present invention relates to a load-lock apparatus, a device manufacturing apparatus, which includes the load-lock apparatus, and a device manufacturing method that manufactures a device using the device manufacturing apparatus.

2. Description of the Related Art

Generally, a semiconductor device is manufactured by subjecting a wafer to various types of processes. Processing chambers used for the respective processes form environments suitable to the processes.

An exposure apparatus which transfers a micropattern, such as a circuit pattern onto a semiconductor wafer or a substrate, such as a liquid crystal display substrate, requires a finer transfer pattern and a higher throughput. To obtain the finer transfer pattern, the exposure apparatus must use exposure light having a shorter wavelength. An exposure light source is shifting from a 365-nm i-line light source to a 248-nm KrF excimer laser source, and to a 193-nm ArF excimer laser source. Furthermore, a 157-nm $F_2$ excimer laser source and an EUV (Extreme Ultra Violet) light source, which are shorter-wavelength light sources, have been developed.

An ArF excimer laser beam, an $F_2$ excimer laser beam, and EUV light attenuate largely in the atmosphere. Hence, the exposure unit of the exposure apparatus is stored in an exposure chamber. The exposure chamber forms a reduced-pressure space where the laser beam does not attenuate largely, or a purged space, which is purged with an inert gas, such as $N_2$ or He.

The exposure chamber which forms the reduced-pressure space or purged space connects to a load-lock chamber to load or unload a wafer or reticle efficiently. The wafer or reticle is loaded from the external space into the exposure chamber or unloaded from the exposure chamber to the external space through the load-lock chamber.

When loading the wafer or reticle from the external space into the exposure chamber, first, it is loaded into the load-lock chamber, and after that, a gate valve isolates the interior of the load-lock chamber from the external space. Then, the interior of the load-lock chamber is pressure-reduced or purged with an inert gas. After that, a gate valve between the load-lock chamber and the exposure chamber is opened, to load the wafer or reticle from the load-lock chamber into the exposure chamber. When unloading the wafer or reticle from the exposure chamber, first, it is unloaded from the exposure chamber to the load-lock chamber, and after that, the gate valve isolates the interior of the load-lock chamber from the exposure chamber. Then, the gate valve between the load-lock chamber and the external space is opened, so the load-lock chamber is open to the atmosphere. The wafer or reticle is unloaded to the external space through the open gate valve.

According to Japanese Patent Laid-Open No. 2003-86668, a lid having a spacer and a lid not having a spacer are prepared as lids for hermetically closing a load-lock chamber. The volume in the load-lock chamber is changed by selecting one of these lids. Also, according to Japanese Patent Laid-Open No. 2003-86668, spacers having different volumes are prepared. The spacers are selectively used.

In the arrangement disclosed in Japanese Patent Laid-Open No. 2003-86668, the spacer changes the volume of the load-lock chamber in accordance with the number of connected wafer cassettes, which are to be loaded into the load-lock chamber, in the connected state. Hence, Japanese Patent Laid-Open No. 2003-86668 does not disclose or suggest any idea of changing the volume in the load-lock chamber where the wafer cassettes have been loaded, or a substrate has been loaded.

SUMMARY OF THE INVENTION

The present invention has been made on the basis of the recognition of the above background, and has as its object to provide, for example, a novel technique which can quickly reduce a pressure in the load-lock chamber.

According to a first aspect of the present invention, a load-lock apparatus comprises a housing including a movable member, and configured to define a volume of a load-lock chamber, and a driving mechanism configured to drive the movable member. The driving mechanism is configured to drive the movable member, after loading an object into the load-lock chamber, and before unloading the object from the load-lock chamber, to change the volume of the load-lock chamber.

According to the preferred embodiment of the present invention, the sealing mechanism can include a bellows or a magnetic fluid sealant.

According to a second aspect of the present invention, a device manufacturing apparatus comprises the load-lock apparatus described above, and a processing apparatus connected to the load-lock apparatus, and configured to process an object conveyed from the load-lock apparatus.

According to a third aspect of the present invention, a method of manufacturing a device comprises steps of placing an object in a vacuum atmosphere using the above device manufacturing apparatus, and processing the placed object using the device manufacturing apparatus, to manufacture the device.

The present invention can provide, for example, a novel technique which can quickly reduce a pressure in the load-lock chamber.

Further features of the present invention will become apparent from the following description of exemplary embodiments, with reference to the attached drawings.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 2A is a sectional view taken along the line A-A of the load-lock chamber shown in FIG. 1;

FIG. 2B is a sectional view taken along the line B-B of the load-lock chamber shown in FIG. 1;

FIGS. 3A and 3B are views, respectively, schematically showing changes in volume in the load-lock chamber according to the first embodiment of the present invention, which occur when driving the top wall and bottom wall of the load-lock chamber;

FIGS. 4A to 4E are views showing an operation according to the first embodiment of the present invention, which takes place since loading a substrate from a conveyance chamber into the load-lock chamber, until unloading the substrate toward a processing chamber;

DESCRIPTION OF THE EMBODIMENTS

The preferred embodiments of the present invention will be described with reference to the accompanying drawings.

Figure 1:
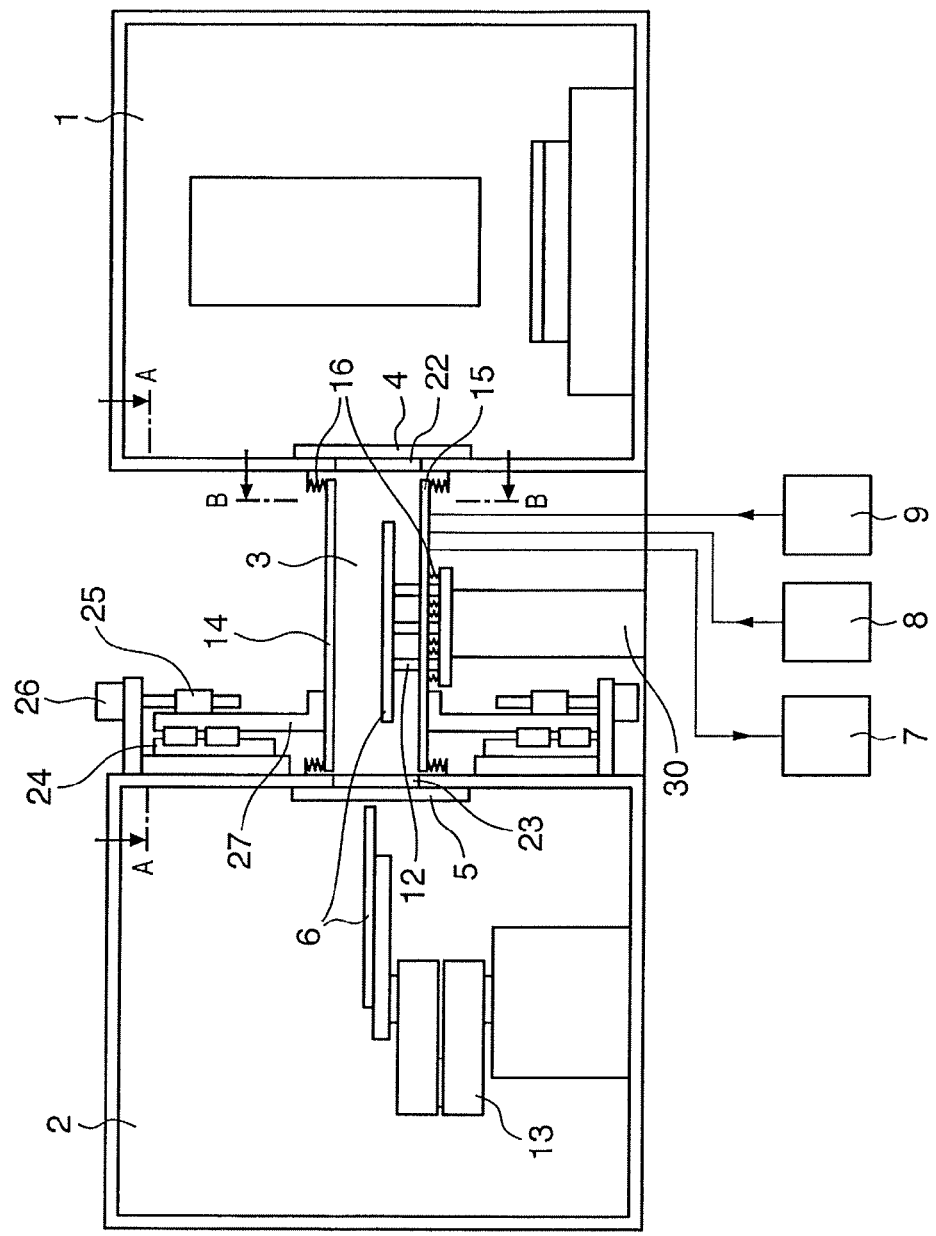
FIG. 1 is a schematic side view of a load-lock apparatus according to the first embodiment of the present invention, and a device manufacturing apparatus which includes the load-lock apparatus.

FIG. 1 is a schematic side view of a load-lock apparatus according to the first embodiment of the present invention, and a device manufacturing apparatus which includes the load-lock apparatus. FIG. 2A is a sectional view taken along the line A-A of a load-lock chamber 3 shown in FIG. 1. FIG. 2B is a sectional view taken along the line B-B of the load-lock chamber 3 shown in FIG. 1. The device manufacturing apparatus according to the first embodiment of the present invention can be applied to a semiconductor manufacturing apparatus, such as a semiconductor exposure apparatus, or a manufacturing apparatus, such as an apparatus for manufacturing a micro-machine.

The device manufacturing apparatus can include a processing chamber 1, a conveyance chamber 2, and the load-lock chamber 3, as chambers, but the conveyance chamber 2 is not indispensable. The processing chamber 1 processes a substrate 6, which is loaded in the chamber 1. For example, this process can include an exposure process, an etching process, a film forming or deposition process (e.g., CVD or PVD), and annealing. A unit (e.g., an exposure unit, a plasma generation unit, or a heat control unit) to process the substrate 6 can be arranged in the processing chamber 1. The interior of the processing chamber 1 is maintained at an inert gas atmosphere of, e.g., $N_2$ gas, to maintain it at a pressure lower than the atmospheric pressure.

The interior of the conveyance chamber 2 can be maintained at, e.g., an atmospheric-pressure air environment. A conveyance device 13 is arranged in the conveyance chamber 2. The conveyance device 13 is configured to supply the substrate 6 to the load-lock chamber 3 and to receive it from the load-lock chamber 3.

The processing chamber 1 connects to the conveyance chamber 2 through the load-lock chamber 3. The load-lock chamber 3 and processing chamber 1 are configured to communicate with each other through a first opening 22. A first gate valve 4 opens/closes the first opening 22. More specifically, opening of the first gate valve 4 allows the load-lock chamber 3 and processing chamber 1 to communicate with each other. Closing of the first gate valve 4 separates the load-lock chamber 3 and processing chamber 1, spatially from each other.

The load-lock chamber 3 and conveyance chamber 2 are configured to communicate with each other through a second opening 23. A second gate valve 5 opens/closes the second opening 23. More specifically, opening of the second gate valve 5 allows the load-lock chamber 3 and conveyance chamber 2 to communicate with each other. Closing of the second gate valve 5 separates the load-lock chamber 3 and conveyance chamber 2, spatially from each other.

Closing of the first gate valve 4 and the second gate valve 5 hermetically closes the load-lock chamber 3.

A substrate support (e.g., a plurality of support pins) 12 is arranged in the load-lock chamber 3. The substrate 6 to be conveyed from the conveyance chamber 2 into the processing chamber 1, or from the processing chamber 1 to the conveyance chamber 2, is temporarily placed on the substrate support 12.

Two opposing side walls 28 define the two side surfaces of the load-lock chamber 3, which are located between the processing chamber 1 and conveyance chamber 2. A top wall 14 defines the upper surface of the load-lock chamber 3. A bottom wall 15 defines the lower surface of the load-lock chamber 3. The side wall of the processing chamber 1 defines the side surface of the load-lock chamber 3 on the processing chamber 1 side. The side wall of the conveyance chamber 2 defines the side surface of the load-lock chamber 3, on the conveyance chamber 2 side. A housing of the load-lock chamber 3 includes the two side walls 28, the top wall 14, bottom wall 15, the side wall of the processing chamber 1, and the side wall of the conveyance chamber 2.

In this embodiment, the top wall 14 and bottom wall 15 are configured to be movable, so that they can change the volume in the load-lock chamber 3, which is in the hermetically sealed state. Driving mechanisms drive the top wall 14 and bottom wall 15, respectively. Alternatively, a driving mechanism may be configured to drive only one of the top wall 14 and bottom wall 15, or at least one of the two side walls 28. It suffices as far as the driving mechanism drives at least one wall or part of at least one wall to change the volume in the load-lock chamber 3, which is in the hermetically sealed state.

A bellows 16 seals the top wall 14 and the four side walls (that is, the two side walls 28, the side wall of the processing chamber 1, and the side wall of the conveyance chamber 2). Another bellows 16 seals the bottom wall 15 and the four side walls (that is, the two side walls 28, the side wall of the processing chamber 1, and the side wall of the conveyance chamber 2).

Preferably, the substrate support 12 is independent of walls configured to be movable, i.e., the top wall 14 and bottom wall 15, in this case. More specifically, the movement of the top wall 14 and bottom wall 15 preferably does not influence the substrate support 12. For example, a support body 30 can support the substrate support 12 through an opening formed in the bottom wall 15. In this case, the bellows 16, which connects the support body 30 to bottom wall 15, to surround the substrate support 12, can seal the opening formed in the bottom wall 15.

The load-lock apparatus can comprise, in addition to the load-lock chamber 3 and the driving mechanisms described above, e.g., an environment control unit which controls the environment in the load-lock chamber 3. The environment control unit can comprise, e.g., an exhaust pump 7, $N_2$ supply source 8, and air source 9. The exhaust pump 7 is employed to exhaust gas in the load-lock chamber 3 or to adjust the pressure in the load-lock chamber 3. The $N_2$ supply source 8 is employed to supply $N_2$ gas into the load-lock chamber 3, which is pressure-reduced by the exhaust pump 7. The air source 9 is employed to restore the interior of the load-lock chamber 3, which is pressure-reduced by, e.g., the exhaust pump 7, to the atmospheric-pressure air atmosphere (normal atmosphere), or to adjust the pressure in the load-lock chamber 3.

The driving mechanism, which drives the top wall 14, can include, e.g., a manipulating portion (flange) 27 fixed to the top wall 14, a linear guide 24, which guides the manipulating portion 27, a feed screw mechanism 25, which drives the manipulating portion 27, and a motor 26, which drives the feed screw mechanism 25. The motor 26 vertically moves the top wall 14. The driving mechanism, which drives the bottom wall 15, can be configured in the same manner as the driving mechanism which drives the top wall 14. These driving mechanisms may comprise various types of other mechanisms, e.g., a cylinder, such as an air cylinder or a hydraulic cylinder, a rack-and-pinion mechanism, or a link mechanism.

These driving mechanisms, the walls driven by them, and the bellows, which serve as the sealing mechanism to hermetically close the load-lock chamber, can change the volume in the load-lock chamber 3, while maintaining the load-lock chamber 3 hermetically closed.

FIGS. 3A and 3B are views, respectively, schematically showing changes in volume in the load-lock chamber 3, which occur when driving the top wall 14 and bottom wall 15 of the load-lock chamber 3. FIG. 3A shows a state wherein the distance between the top wall 14 and bottom wall 15 is set at the first distance. FIG. 3B is a view showing a state wherein the distance between the top wall 14 and bottom wall 15 is set at the second distance (first distance>second distance). The top wall 14 is set at the first height in FIG. 3A and at the second height (first height>second height), in FIG. 3B. The bottom wall 15 is set at the third height in FIG. 3A and at the fourth height (third height<fourth height), in FIG. 3B. When changing the respective positions of the top wall 14 and bottom wall 15 from the state shown in FIG. 3A to the state shown in FIG. 3B, this changes the volume in the load-lock chamber 3 from the first volume to the second volume (first volume>second volume).

As a substrate conveyance sequence in the device manufacturing apparatus according to the first embodiment of the present invention, a case of conveying the substrate 6 in the conveyance chamber 2 to the processing chamber 1 through the load-lock chamber 3 will be described with reference to FIGS. 4A to 4E. In FIGS. 4A to 4E, the driving mechanisms are omitted for the sake of simplicity. As an example, assume that the interior of the conveyance chamber 2 is an atmospheric-pressure air atmosphere, and that the interior of the conveyance chamber 2 is a reduced-pressure $N_2$ purged atmosphere. In the initial state, assume that both the first gate valve 4 and the second gate valve 5 are closed, and that the interior of the load-lock chamber 3 is an atmospheric-pressure air atmosphere.

FIGS. 4A to 4E are views showing an operation that takes place, since loading the substrate 6 from the conveyance chamber 2 into the load-lock chamber 3, until unloading the substrate 6 toward the processing chamber 1. First, as shown in FIG. 4A, when the top wall 14 and bottom wall 15 of the load-lock chamber 3 are at the first and third heights, respectively, the second gate valve 5 is opened, and the conveyance device 13 loads the substrate 6 from the conveyance chamber 2 into the load-lock chamber 3. At this time, the substrate 6 is placed on the substrate support 12. Note that the first and third heights ensure a space between the top wall 14 and bottom wall 15, which is sufficient for the conveyance device 13 to convey the substrate 6.

As shown in FIG. 4B, before closing the second gate valve 5, which separates the conveyance chamber 2 from the load-lock chamber 3, the top wall 14 is moved downward to the second height, and the bottom wall 15 is moved upward to the fourth height. Note that the first height is greater than the second height and the third height is less than the fourth height. The movement of the top wall 14 and bottom wall 15 reduces the volume in the load-lock chamber 3, and moves air corresponding to the reduced volume into the conveyance chamber 2.

As shown in FIG. 4C, the second gate valve 5, which separates the conveyance chamber 2 from the load-lock chamber 3, is closed to hermetically close the load-lock chamber 3. The pressure in the load-lock chamber 3 in this state is atmospheric pressure. The volume in the load-lock chamber 3, in this state, is defined as the second volume.

In the state shown in FIG. 4C, the atmosphere in the load-lock chamber 3 is changed to be the same atmosphere as that in the processing chamber 1. First, the vacuum pump 7 evacuates (reduces the pressure in) the interior of the load-lock chamber 3 to a predetermined vacuum degree. As the volume in the load-lock chamber 3 has been reduced to the second volume, the absolute amount (number of molecules) of air that should be exhausted until the interior of the load-lock chamber 3 reaches the predetermined vacuum degree is less than that in a case wherein the volume in the load-lock chamber 3 has not been reduced. This can shorten the time required to reduce the pressure in the interior of the load-lock chamber 3 to the predetermined vacuum degree.

After the interior of the load-lock chamber 3 reaches the predetermined vacuum degree, the $N_2$ supply source 8 supplies $N_2$ gas into the load-lock chamber 3, as shown in FIG. 4D. The $N_2$ gas supply amount is preferably determined such that the pressure in the load-lock chamber 3, and that in the processing chamber 1, are almost equal, when the volume in the load-lock chamber 3 is the first volume. Simultaneous to or before or after the supply of the $N_2$ gas, the top wall 14 is moved upward to the first height, and the bottom wall 15 is moved downward to the third height. As described above, the first height is greater than the second height, and the third height is less than the fourth height. This vertical movement of the top wall 14 and bottom wall 15 increases the volume in the load-lock chamber 3 from the second volume to the first volume (first volume>second volume).

Subsequently, in the state shown in FIG. 4D, when necessary, the pressure in the load-lock chamber 3 is adjusted so that it becomes almost equal to that in the processing chamber 1. Control of exhausting by the $N_2$ supply source 8 and/or vacuum pump 7 can adjust the pressure in the load-lock chamber 3. Alternatively, changing of the volume of the load-lock chamber 3 by driving the wall members, such as the top wall 14 and bottom wall 15, can adjust the pressure in the load-lock chamber 3.

As shown in FIG. 4E, the first gate valve 4, which separates the processing chamber 1 from the load-lock chamber 3, is opened, and a conveyance device (not shown) conveys the substrate 6 from the load-lock chamber 3 into the processing chamber 1. This conveyance device is arranged in, e.g., the processing chamber 1, and can be configured to extend its hand from the interior of the processing chamber 1 into the load-lock chamber 3 to receive the substrate 6 on the substrate support 12. As described above, the first height and the third height ensure a space between the top wall 14 and bottom wall 15, which is sufficient for the conveyance device 13 to convey the substrate 6.

When conveyance of the substrate 6 to an appropriate portion (e.g., a substrate receiving table, substrate support table, or substrate stage) in the processing chamber 1 is complete, the first gate valve 4 is closed, to render the processing chamber 1 a hermetically closed space. In this state, the substrate 6 is processed in the processing chamber 1.

When the process for the substrate 6 is complete in the processing chamber 1, the first gate valve 4 is opened, and a robot (not shown) conveys the processed substrate 6 from the processing chamber 1 into the load-lock chamber 3. Then, the first gate valve 4 is closed, and the air source 9 supplies air into the load-lock chamber 3 to set the atmospheric pressure in the load-lock chamber 3. The second gate valve 5 is opened, and the conveyance device 13 conveys the substrate 6 in the load-lock chamber 3 to the conveyance chamber 2. After that, the second gate valve 5 is closed. When conveying the substrate 6 from the processing chamber 1, to the conveyance chamber 2 through the load-lock chamber 3, the volume in the load-lock chamber 3 is maintained at the first volume (the top wall 14 is at the first height, and the bottom wall 15 is at the third height).

As described above, when loading and unloading the substrate into and from the load-lock chamber 3, the volume in the load-lock chamber 3 increases, to enable substrate conveyance. This ensures a sufficient conveying space.

The driving mechanisms drive the walls, such as the top wall 14 and bottom wall 15, to reduce the volume in the load-lock chamber 3, and the load-lock chamber 3 is hermetically closed. In this state, the gas in the load-lock chamber 3 is exhausted. This can decrease the absolute amount (number of molecules) of gas to be discharged from the load-lock chamber 3, and can shorten the time necessary to reduce the pressure in the load-lock chamber 3 to the predetermined vacuum degree.

When exhausting the gas from (reducing the pressure in) the interior of the load-lock chamber 3, the timing to drive the walls, such as the top wall 14 and bottom wall 15, to decrease the volume in the load-lock chamber 3 may be before closing the second gate valve 5 completely. In other words, if driving the walls at the timing before closing the second gate valve 5 completely, as the volume in the load-lock chamber 3 decreases, the gas in the load-lock chamber 3 is exhausted through the second opening 23.

Figure 5:
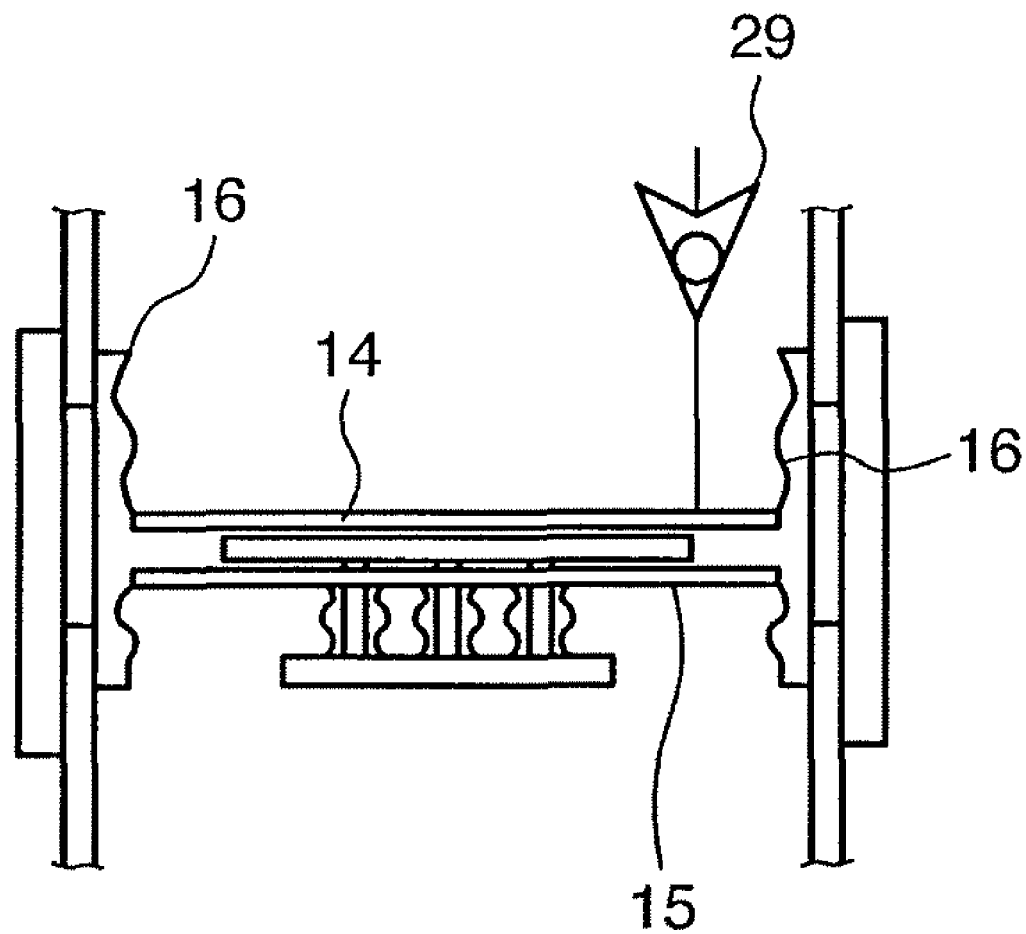
FIG. 5 is a view showing a modification of the load-lock apparatus according to the first embodiment of the present invention.

As shown in FIG. 5, a relief valve 29 may connect to the load-lock chamber 3. When the interior of the load-lock chamber 3 reaches a predetermined pressure (for example, atmospheric pressure) or more, the gas in the load-lock chamber 3 may be discharged through the relief valve 29. This can also exhaust the gas in the load-lock chamber 3 as the volume in the load-lock chamber 3 reduces. Therefore, even after conveying the substrate 6 into the load-lock chamber 3, and closing the second gate valve 5, as the volume in the load-lock chamber 3 reduces, the gas in the load-lock chamber 3 is exhausted through the relief valve 29. This reduces the absolute amount (number of molecules) of gas in the load-lock chamber 3 that should be exhausted by the vacuum pump 7, and shortens the time required to reduce the pressure in the interior of the load-lock chamber 3 to the predetermined vacuum degree.

When changing the atmosphere in the load-lock chamber 3 to the same atmosphere as that in the processing chamber 1, the timing to drive the walls, such as the top wall 14 and bottom wall 15, to increase the volume in the load-lock chamber 3, may also be controlled in the following manner. More specifically, the volume of the load-lock chamber can increase at an arbitrary timing, which is after the volume reduction of the load-lock chamber exhausts the gas in the load-lock chamber and closing of the second gate valve 5, and before conveying the substrate from the load-lock chamber to the processing chamber. For example, the volume of the load-lock chamber 3 can increase while the vacuum pump 7 exhausts the gas, since the gas exhausting until $N_2$ purge, or during $N_2$ purge. Alternatively, the volume of the load-lock chamber 3 can increase after the end of the $N_2$ purge and before a start of opening of the first gate valve 4, or during opening of the first gate valve 4, although this may influence the atmosphere in the processing chamber 1. If the volume of the load-lock chamber 3 increases while the vacuum pump 7 exhausts the gas, this can decrease the vacuum degree in the load-lock chamber 3, to shorten the pressure reduction time necessary to reach the target vacuum degree.

Figure 6:
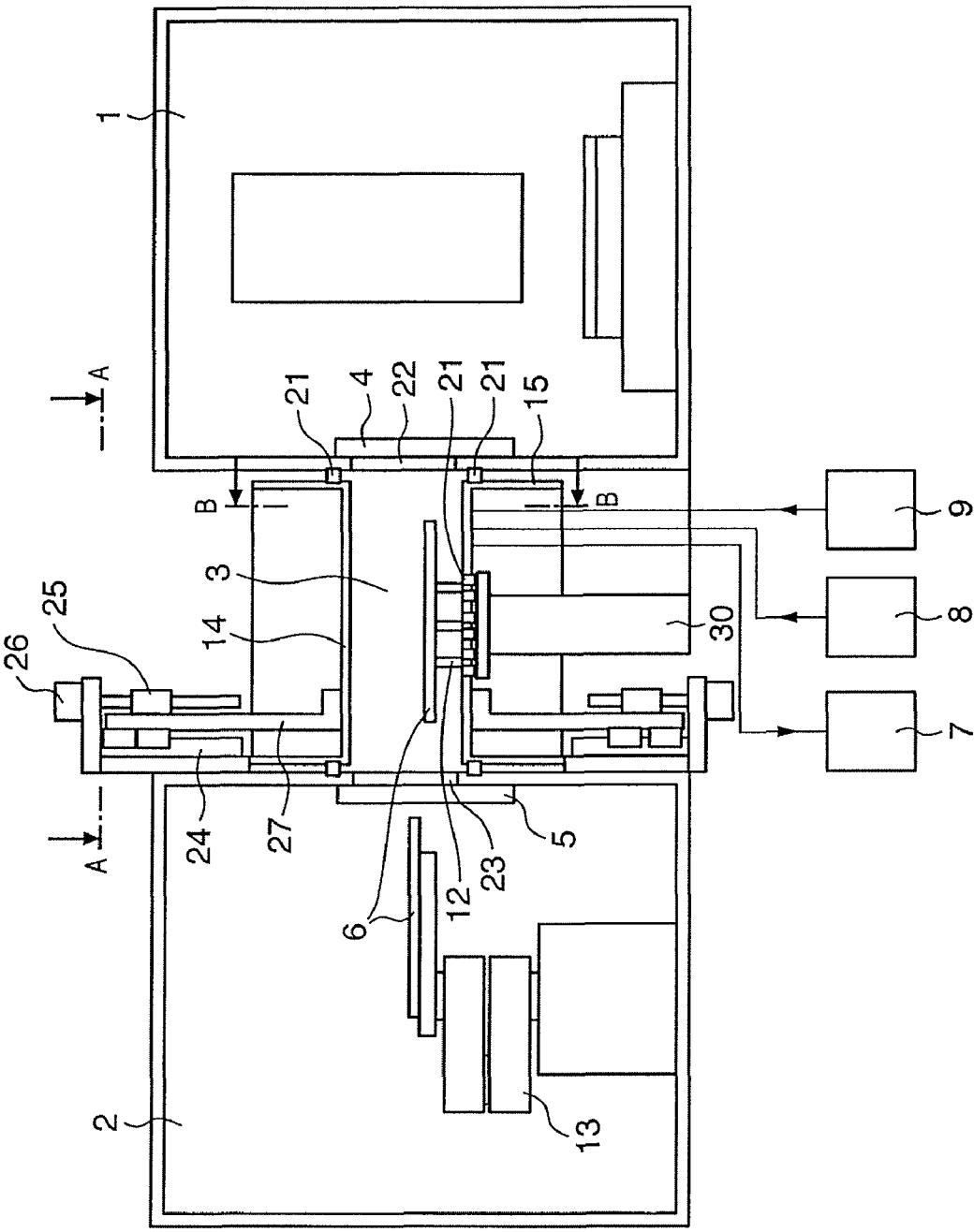
FIG. 6 is a schematic side view of a load-lock apparatus according to the second embodiment of the present invention, and a device manufacturing apparatus which includes the load-lock apparatus.
Figure 7B:
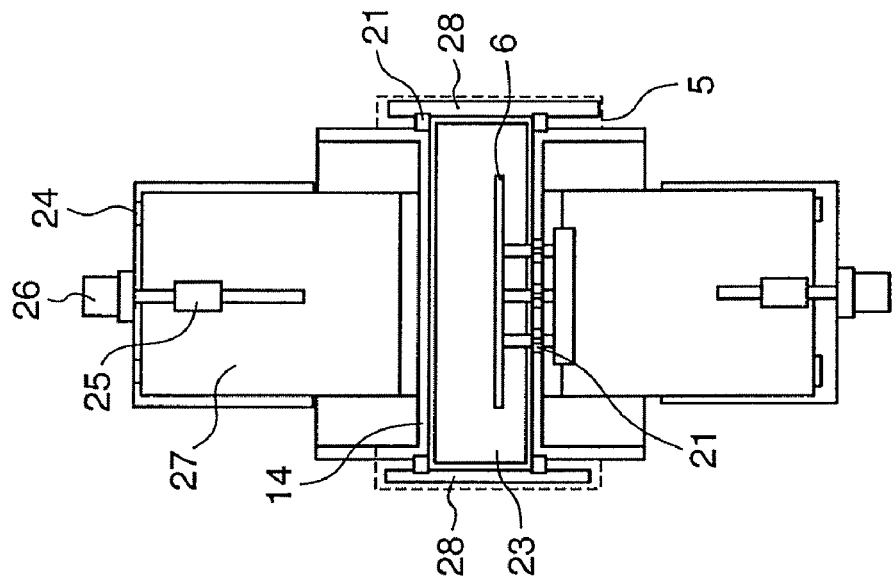
FIG. 7B is a sectional view taken along the line B-B of the load-lock chamber shown in FIG. 6.
Figure 7A:
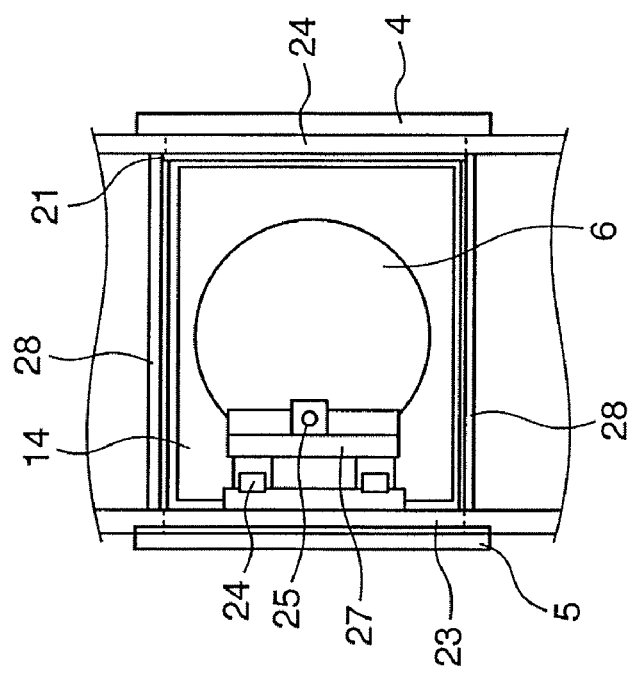
FIG. 7A is a sectional view taken along the line A-A of the load-lock chamber shown in FIG. 6.

FIG. 6 is a schematic side view of a load-lock apparatus according to the second embodiment of the present invention, and a device manufacturing apparatus which includes the load-lock apparatus. FIG. 7A is a sectional view taken along the line A-A of a load-lock chamber 3 shown in FIG. 6. FIG. 7B is a sectional view taken along the line B-B of the load-lock chamber 3 shown in FIG. 6. A semiconductor manufacturing apparatus, such as a semiconductor exposure apparatus, as well as a manufacturing apparatus, such as an apparatus that manufactures a micromachine, can adopt the device manufacturing apparatus according to the second embodiment of the present invention.

The device manufacturing apparatus can include a processing chamber 1, a conveyance chamber 2, and the load-lock chamber 3, as chambers, but the conveyance chamber 2 is not indispensable. The processing chamber 1 processes a substrate 6, which is loaded in it. For example, this process can include an exposure process, an etching process, a film forming process or a deposition process (e.g., CVD or PVD), and annealing. A unit (e.g., an exposure unit, a plasma generation unit, or a heat control unit) to process the substrate 6 can be arranged in the processing chamber 1. The interior of the processing chamber 1 is maintained at an inert gas atmosphere of, e.g., $N_2$ gas, to maintain it at a pressure lower than the atmospheric pressure.

The interior of the conveyance chamber 2 can be maintained at, e.g., an atmospheric-pressure air atmosphere. A conveyance device 13 is arranged in the conveyance chamber 2. The conveyance device 13 is configured to supply the substrate 6 to the load-lock chamber 3 and to receive it from the load-lock chamber 3.

The processing chamber 1 connects to the conveyance chamber 2 through the load-lock chamber 3. The load-lock chamber 3 and processing chamber 1 are configured to communicate with each other through a first opening 22. A first gate valve 4 opens/closes the first opening 22. More specifically, opening of the first gate valve 4 allows the load-lock chamber 3 and processing chamber 1 to communicate with each other. Closing of the first gate valve 4 separates the load-lock chamber 3 and processing chamber 1, spatially, from each other.

The load-lock chamber 3 and conveyance chamber 2 are configured to communicate with each other through a second opening 23. A second gate valve 5 opens/closes the second opening 23. More specifically, opening of the second gate valve 5 allows the load-lock chamber 3 and conveyance chamber 2 to communicate with each other. Closing of the second gate valve 5 separates the load-lock chamber 3 and conveyance chamber 2, spatially, from each other.

Closing of the first and second gate valves 4 and 5 hermetically closes the load-lock chamber 3. A substrate support (e.g., a plurality of support pins) 12 is arranged in the load-lock chamber 3. The substrate 6 to convey from the conveyance chamber 2 into the processing chamber 1, or from the processing chamber 1 to the conveyance chamber 2, is temporarily placed on the substrate support 12.

Two opposing side walls 28 define the two side surfaces of the load-lock chamber 3, which are between the processing chamber 1 and conveyance chamber 2. A top wall 14 defines the upper surface of the load-lock chamber 3. A bottom wall 15 defines the lower surface of the load-lock chamber 3. The side wall of the processing chamber 1 defines the side surface of the load-lock chamber 3 on the processing chamber 1 side. The side wall of the conveyance chamber 2 defines the side surface of the load-lock chamber 3 on the conveyance chamber 2 side.

In this embodiment, the top wall 14 and bottom wall 15 are configured to be movable, so that they can change the volume in the load-lock chamber 3, which is in the hermetically sealed state. Driving mechanisms drive the top wall 14 and bottom wall 15, respectively. Alternatively, a driving mechanism may be configured to drive only one of the top wall 14 and bottom wall 15, or at least one of the two side walls 28. It suffices as far as the driving mechanism drives at least one wall to change the volume in the load-lock chamber 3, which is in the hermetically sealed state.

A magnetic fluid sealant 21 seals the top wall 14 and the four side walls (that is, the two side walls 28, the side wall of the processing chamber 1, and the side wall of the conveyance chamber 2). Another magnetic fluid sealant 21 seals the bottom wall 15 and the four side walls (that is, the two side walls 28, the side wall of the processing chamber 1, and the side wall of the conveyance chamber 2).

Preferably, the substrate support 12 is independent of walls configured to be movable, i.e., the top wall 14 and bottom wall 15, in this case. More specifically, the movement of the top wall 14 and bottom wall 15 preferably does not influence the substrate support 12. For example, a support body 30 can support the substrate support 12 through an opening formed in the bottom wall 15. In this case, the magnetic fluid sealant 21 can seal the opening formed in the bottom wall 15.

The load-lock apparatus can comprise, in addition to the load-lock chamber 3 and the driving mechanisms described above, e.g., an environment control unit, which controls the environment in the load-lock chamber 3. The environment control unit can comprise, e.g., an exhaust pump 7, an $N_2$ supply source 8, and an air source 9. The exhaust pump 7 is employed to exhaust gas in the load-lock chamber 3 or to adjust the pressure in the load-lock chamber 3. The $N_2$ supply source 8 is employed to supply $N_2$ gas into the load-lock chamber 3, which is pressure-reduced by the exhaust pump 7. The air source 9 is employed to restore the interior of the load-lock chamber 3, which is pressure-reduced by, e.g., the exhaust pump 7, to the atmospheric pressure air atmosphere, or to adjust the pressure in the load-lock chamber 3.

The driving mechanism which drives the top wall 14 can include, e.g., a manipulating portion (flange) 27 fixed to the top wall 14, a linear guide 24, which guides the manipulating portion 27, a feed screw mechanism 25, which drives the manipulating portion 27, and a motor 26, which drives the feed screw mechanism 25. The motor 26 vertically moves the top wall 14. The driving mechanism, which drives the bottom wall 15, can be configured in the same manner as the driving mechanism which drives the top wall 14. These driving mechanisms may comprise various types of other mechanisms, e.g., a cylinder, such as an air cylinder or a hydraulic cylinder, a rack-and-pinion mechanism, or a link mechanism.

These driving mechanisms, the walls driven by them, and the magnetic fluid sealants, which serve as the sealing mechanism to hermetically close the load-lock chamber, can change the volume in the load-lock chamber 3, while maintaining the load-lock chamber 3 hermetically closed.

Figure 8B:
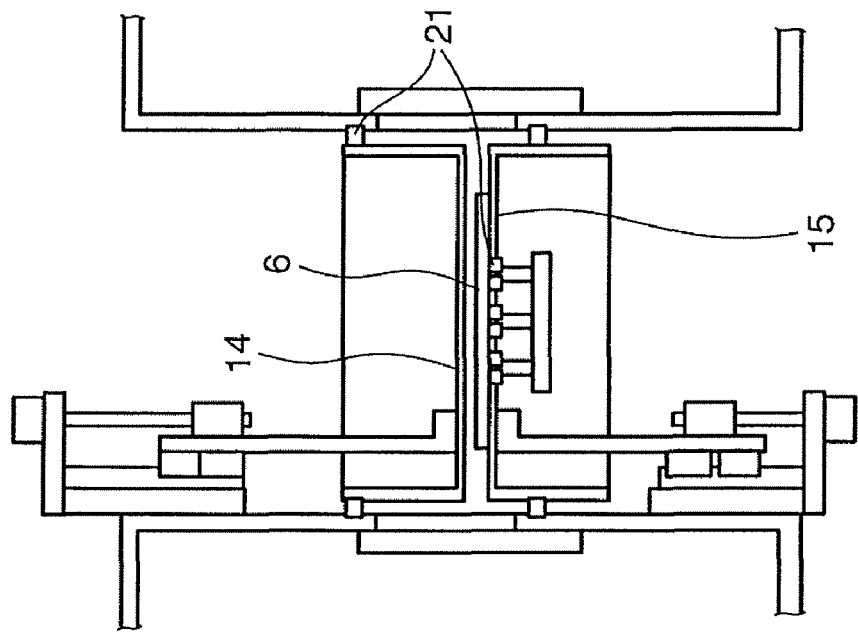
FIGS. 8A and 8B are views, respectively, schematically showing changes in volume in the load-lock chamber according to the second embodiment of the present invention, which occur when driving the top wall and bottom wall of the load-lock chamber.
Figure 8A:
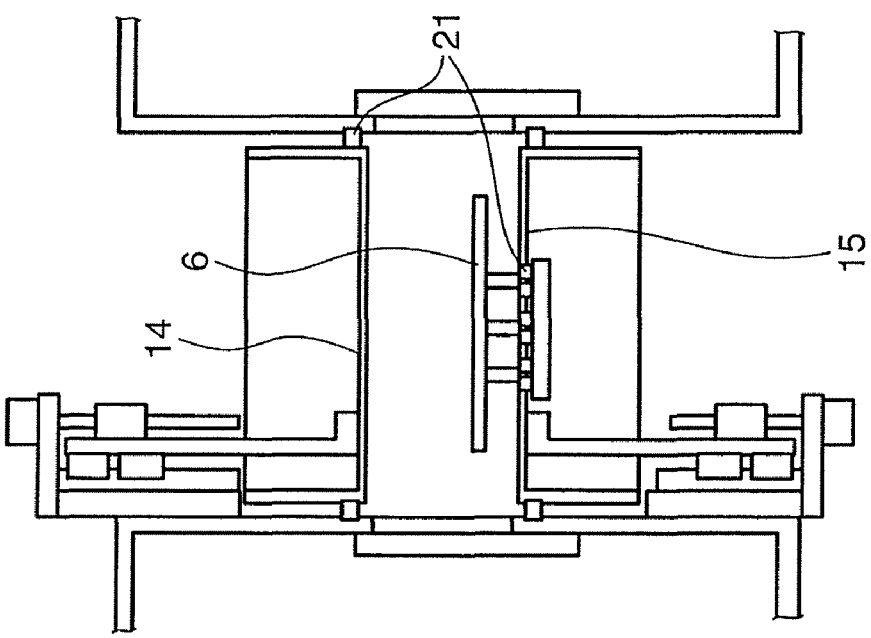

FIGS. 8A and 8B are views, respectively, schematically showing changes in volume in the load-lock chamber 3, which occur when driving the top wall 14 and bottom wall 15 of the load-lock chamber 3. FIG. 8A shows a state wherein the distance between the top wall 14 and bottom wall 15 is set at the first distance. FIG. 8B is a view showing a state wherein the distance between the top wall 14 and bottom wall 15 is set at the second distance (first distance>second distance). The top wall 14 is set at the first height in FIG. 8A and at the second height (first height>second height) in FIG. 8B. The bottom wall 15 is set at the third height in FIG. 8A and at the fourth height (third height<fourth height) in FIG. 8B. When changing the respective positions of the top wall 14 and bottom wall 15 from the state shown in FIG. 8A to the state shown in FIG. 8B, this changes the volume in the load-lock chamber 3 from the first volume to the second volume (first volume>second volume).

As a substrate conveyance sequence in the device manufacturing apparatus according to the second embodiment of the present invention, a case of conveying the substrate 6 in the conveyance chamber 2 to the processing chamber 1 through the load-lock chamber 3 will be described with reference to FIGS. 9A to 9E. In FIGS. 9A to 9E, the driving mechanisms are omitted for the sake of simplicity. As an example, assume that the interior of the conveyance chamber 2 is an atmospheric-pressure air atmosphere, and that the interior of the conveyance chamber 2 is a reduced-pressure $N_2$ purged atmosphere. In the initial state, assume that both the first gate valve 4 and second gate valve 5 are closed, and that the interior of the load-lock chamber 3 is at an atmospheric-pressure air atmosphere.

Figure 9C:
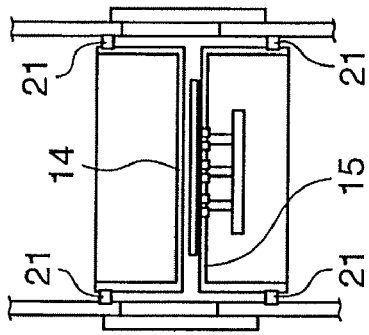
FIGS. 9A to 9E are views showing an operation according to the second embodiment of the present invention, which takes place since loading a substrate from a conveyance chamber into the load-lock chamber, until unloading the substrate toward a processing chamber.
Figure 9B:
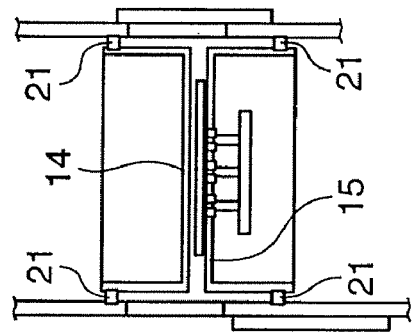
Figure 9E:
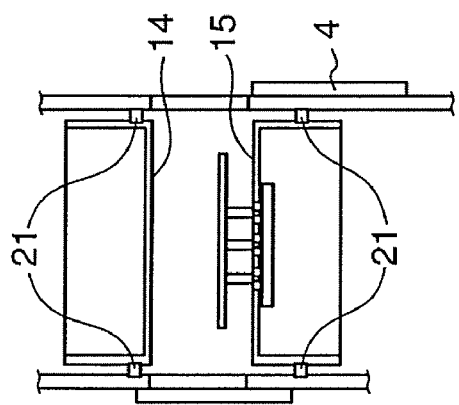
Figure 9A:
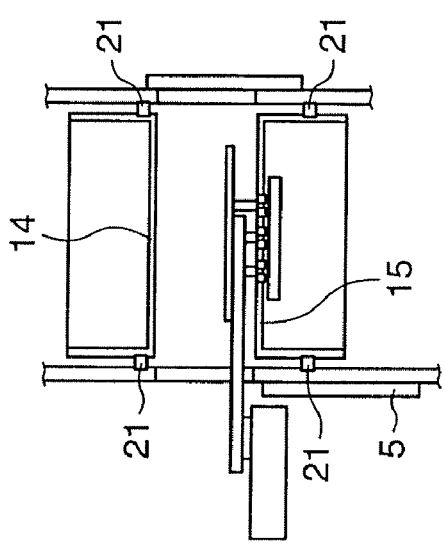

FIGS. 9A to 9E are views showing an operation that takes place since loading the substrate 6 from the conveyance chamber 2 into the load-lock chamber 3 until unloading the substrate 6 toward the processing chamber 1. First, as shown in FIG. 9A, when the top wall 14 and bottom wall 15 of the load-lock chamber 3 are at the first and third heights, respectively, the second gate valve 5 is opened, and the conveyance device 13 loads the substrate 6 from the conveyance chamber 2 into the load-lock chamber 3. At this time, the substrate 6 is placed on the substrate support 12. Note that the first and third heights ensure a space between the top wall 14 and bottom wall 15, which is sufficient for the conveyance device 13 to convey the substrate 6.

As shown in FIG. 9B, before closing the second gate valve 5, which separates the conveyance chamber 2 from the load-lock chamber 3, the top wall 14 is moved downward to the second height, and the bottom wall 15 is moved upward to the fourth height. Note that the first height is greater than the second height and the third height is less than the fourth height. The movement of the top wall 14 and bottom wall 15 reduces the volume in the load-lock chamber 3, and moves air corresponding to the reduced volume into the conveyance chamber 2.

As shown in FIG. 9C, the second gate valve 5, which separates the conveyance chamber 2 from the load-lock chamber 3, is closed to hermetically close the load-lock chamber 3. The pressure in the load-lock chamber 3, in this state, is atmospheric pressure. The volume in the load-lock chamber 3, in this state, is defined as the second volume.

In the state shown in FIG. 9C, the atmosphere in the load-lock chamber 3 is purged with the same atmosphere as that in the processing chamber 1. First, the vacuum pump 7 evacuates (reduces the pressure in) the interior of the load-lock chamber 3 to a predetermined vacuum degree. As the volume in the load-lock chamber 3 has been reduced to the second volume, the absolute amount (number of molecules) of air that should be exhausted until the interior of the load-lock chamber 3 reaches the predetermined vacuum degree is less than that in a case wherein the volume in the load-lock chamber 3 has not been reduced. This can shorten the time required to reduce the pressure in the interior of the load-lock chamber 3 to the predetermined vacuum degree.

Figure 9D:
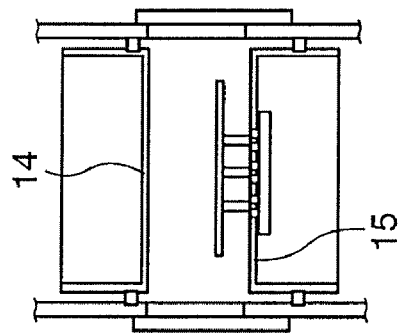

After the interior of the load-lock chamber 3 reaches the predetermined vacuum degree, the $N_2$ supply source 8 supplies $N_2$ gas into the load-lock chamber 3, as shown in FIG. 9D. The $N_2$ gas supply amount is preferably determined such that the pressure in the load-lock chamber 3 and that in the processing chamber 1 are almost equal when the volume in the load-lock chamber 3 is the first volume. Simultaneous to or before or after the supply of the $N_2$ gas, the top wall 14 is moved upward to the first height, and the bottom wall 15 is moved downward to the third height. As described above, the first height is greater than the second height, and the third eight is less than the fourth height. This vertical movement of the top wall 14 and bottom wall 15 increases the volume in the load-lock chamber 3 from the second volume to the first volume (first volume>second volume).

Subsequently, in the state shown in FIG. 9D, when necessary, the pressure in the load-lock chamber 3 is adjusted so that it becomes almost equal to that in the processing chamber 1. Control of exhausting by the $N_2$ supply source 8 and/or vacuum pump 7 can adjust the pressure in the load-lock chamber 3. Alternatively, changing of the volume of the load-lock chamber 3 by driving the wall members, such as the top wall 14 and bottom wall 15, can adjust the pressure in the load-lock chamber 3.

As shown in FIG. 9E, the first gate valve 4, which separates the processing chamber 1 from the load-lock chamber 3, is opened, and a conveyance device (not shown) conveys the substrate 6 from the load-lock chamber 3 into the processing chamber 1. This conveyance device is arranged in, e.g., the processing chamber 1, and can be configured to extend its hand from the interior of the processing chamber 1 into the load-lock chamber 3 to receive the substrate 6 on the substrate support 12. As described above, the first height and third height ensure a space between the top wall 14 and bottom wall 15, which is sufficient for the conveyance device 13 to convey the substrate 6.

When conveyance of the substrate 6 to an appropriate portion (e.g., a substrate receiving table, substrate support table, or substrate stage) in the processing chamber 1 is complete, the first gate valve 4 is closed, to render the processing chamber 1 a hermetically closed space. In this state, the substrate 6 is processed in the processing chamber 1.

When the process for the substrate 6 is complete in the processing chamber 1, the first gate valve 4 is opened, and a robot (not shown) conveys the processed substrate 6 from the processing chamber 1 into the load-lock chamber 3. Then, the first gate valve 4 is closed, and the air source 9 supplies air into the load-lock chamber 3 to set atmospheric pressure in the load-lock chamber 3. The second gate valve 5 is opened, and the conveyance device 13 conveys the substrate 6 in the load-lock chamber 3 to the conveyance chamber 2. After that, the second gate valve 5 is closed. When conveying the substrate 6 from the processing chamber 1 to the conveyance chamber 2, through the load-lock chamber 3, the volume in the load-lock chamber 3 is maintained at the first volume (the top wall 14 is at the first height, and the bottom wall 15 is at the third height).

As described above, when loading and unloading the substrate into and from the load-lock chamber 3, the volume in the load-lock chamber 3 increases, to enable substrate conveyance. This ensures a sufficient conveying space.

The driving mechanisms drive the walls, such as the top wall 14 and bottom wall 15, to reduce the volume in the load-lock chamber 3, and the load-lock chamber 3 is hermetically closed. In this state, the gas in the load-lock chamber 3 is exhausted. This can decrease the absolute amount (number of molecules) of gas to be discharged from the load-lock chamber 3, and can shorten the time necessary to reduce the pressure in the load-lock chamber 3 to the predetermined vacuum degree.

When exhausting the gas from (reducing the pressure in) the interior of the load-lock chamber 3, the timing to drive the walls, such as the top wall 14 and bottom wall 15, to decrease the volume in the load-lock chamber 3, may be before closing the second gate valve 5 completely. In other words, if driving the walls at the timing before closing the second gate valve 5 completely, as the volume in the load-lock chamber 3 decreases, the gas in the load-lock chamber 3 is exhausted through the second opening 23.

Figure 10:
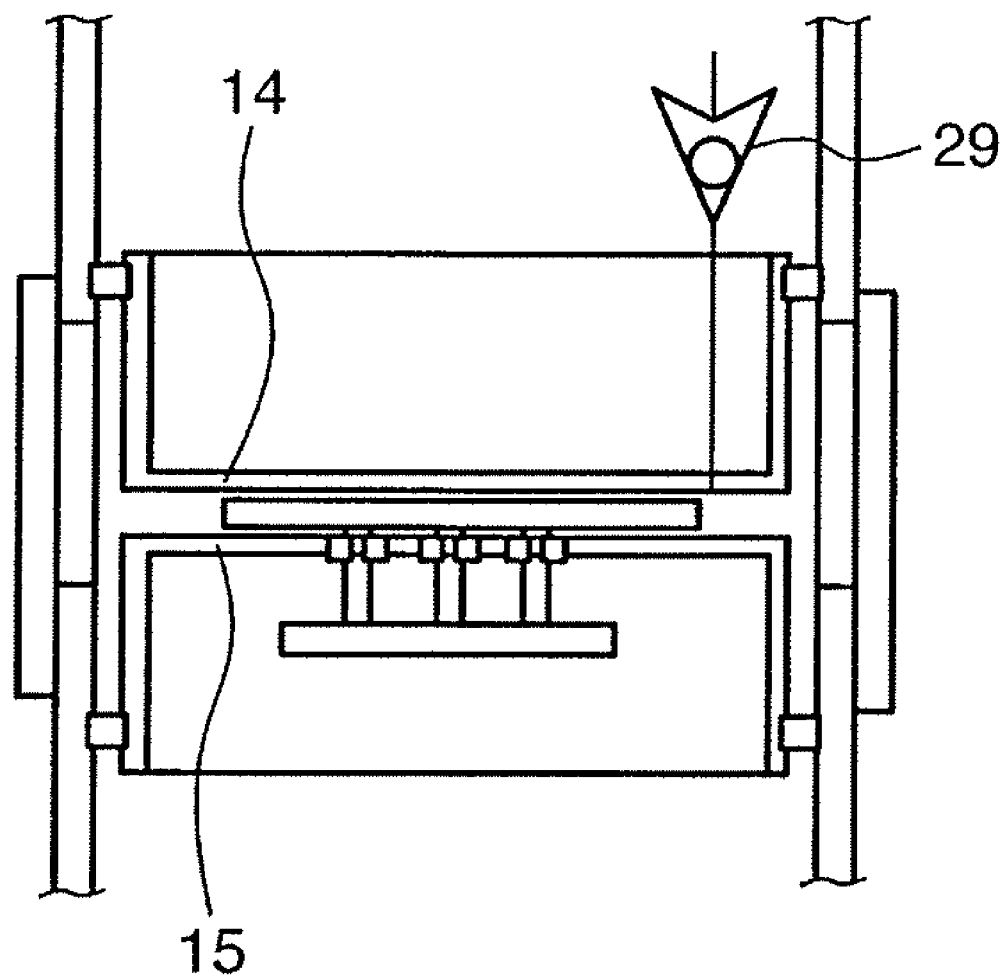
FIG. 10 is a view showing a modification of the load-lock apparatus according to the second embodiment of the present invention.

As shown in FIG. 10, a relief valve 29 may connect to the load-lock chamber 3. When the interior of the load-lock chamber 3 reaches a predetermined pressure (for example, atmospheric pressure), or more, the gas in the load-lock chamber 3 may be discharged through the relief valve 29. This can also exhaust the gas in the load-lock chamber 3 as the volume in the load-lock chamber 3 reduces. Therefore, even after conveying the substrate 6 into the load-lock chamber 3 and closing the second gate valve 5, as the volume in the load-lock chamber 3 reduces, the gas in the load-lock chamber 3 is exhausted through the relief valve 29. This reduces the absolute amount (number of molecules) of gas in the load-lock chamber 3 that should be exhausted by the vacuum pump 7, and shortens the time required to reduce the pressure in the interior of the load-lock chamber 3 to the predetermined vacuum degree.

When purging the atmosphere in the load-lock chamber 3 with the same atmosphere as that in the processing chamber 1, the timing to drive the walls, such as the top wall 14 and bottom wall 15, to increase the volume in the load-lock chamber 3, may also be controlled in the following manner. More specifically, the volume of the load-lock chamber can increase at an arbitrary timing, which is after the volume reduction of the load-lock chamber exhausts the gas in the load-lock chamber and closing of the second gate valve 5, and before conveying the substrate from the load-lock chamber the processing chamber. For example, the volume of the load-lock chamber 3 can increase, while the vacuum pump 7 exhausts the gas, since the gas exhausting until $N_2$ purge, or during $N_2$ purge. Alternatively, the volume of the load-lock chamber 3 can increase after the end of the $N_2$ purge and before a start of opening of the first gate valve 4, or during opening of the first gate valve 4, although this may influence the atmosphere in the processing chamber 1. If the volume of the load-lock chamber 3 increases while the vacuum pump 7 exhausts the gas, this can decrease the vacuum degree in the load-lock chamber 3, to shorten the pressure reduction time necessary until reaching the target vacuum degree.

The first and second embodiments will be complemented hereinafter. When exhausting the gas from (reducing the pressure in) the interior of the load-lock chamber 3, the walls, such as the top wall 14 and bottom wall 15, can be driven, during evacuation by the vacuum pump 7, to reduce the volume in the load-lock chamber 3. In this case, the pressure in the load-lock chamber 3 can increase during evacuation by the vacuum pump 7. This can prolong the operating time of the vacuum pump 7 necessary until the pressure in the load-lock chamber 3 reaches the level, which is related to the capability of the vacuum pump 7. Thus, the vacuum pump 7 can exhaust a larger amount of air when compared to a case of not changing the volume of the load-lock chamber 3. In other words, assume two cases of evacuation with the volume in the load-lock chamber being reduced and not being reduced. If the pressure in the load-lock chamber is kept unchanged, the absolute amount of air in the load-lock chamber is less in the former case. Therefore, restoration of the volume in the load-lock chamber from the reduced volume to the original volume can provide a lower pressure.

In the first and second embodiments, driving of the walls, such as the top wall and bottom wall of the load-lock chamber, changes the volume of the load-lock chamber. Another arrangement can also change the volume. For example, projecting or recessing of some of the walls can also change the volume of the load-lock chamber. Relocating of the gate valves or some gate valve, or changing of the volumes of the members in the load-lock chamber can also change the volume in the load-lock chamber.

The atmosphere or environment in the processing chamber can be determined arbitrarily. For example, a reduced-pressure inert gas environment, a reduced-pressure air environment, an inert gas environment with an approximately atmospheric pressure, or an inert gas environment with a pressure equal to or higher than the atmospheric pressure can form in the processing chamber. The inert gas can include $N_2$ gas, He gas, or the like.

A target object (object) to be conveyed using the load-lock chamber can include all that should be conveyed between different environments, e.g., a substrate, such as a wafer or a glass substrate, or a reticle.

When not using the load-lock chamber, its volume may be reduced. When using the load-lock chamber, an inert gas may be supplied to it. This can decrease the probability of the existence of an impurity gas or moisture in the load-lock chamber. Conveyance of the substrate between the load-lock chamber and processing chamber, with the inert gas being introduced into the load-lock chamber, can further prevent inflow of the inert gas or moisture into the processing chamber. Alternatively, the inert gas may be introduced into the load-lock chamber, evacuation may be performed, and after that, the substrate may be conveyed between the load-lock chamber and the processing chamber. This can further prevent inflow of the impurity gas or moisture into the processing chamber.

Figure 11:
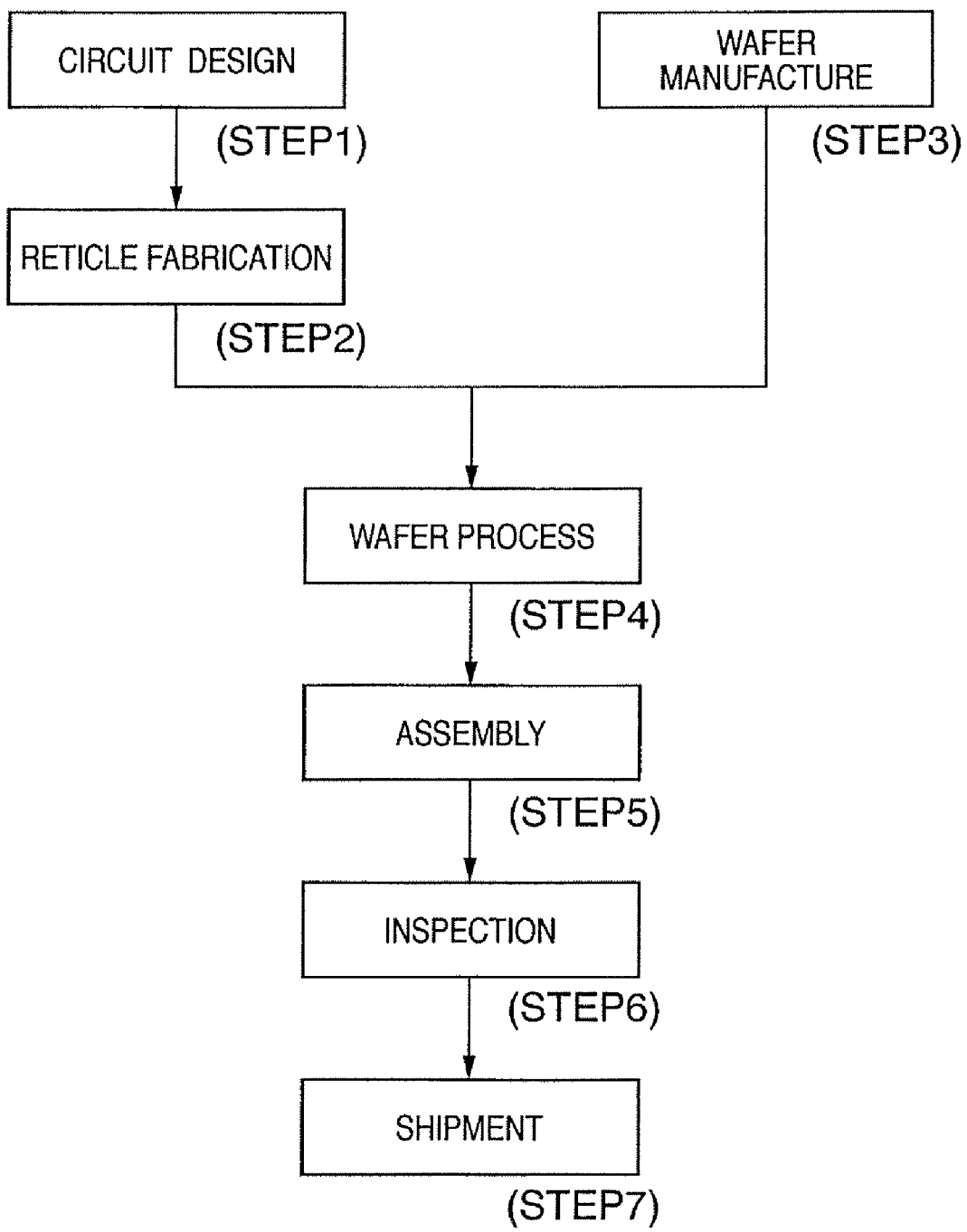
FIG. 11 is a flowchart to explain the steps to manufacture of a device.

A device manufacturing method, which uses the device manufacturing apparatus described above, will be described as an example, with reference to FIGS. 11 and 12. FIG. 11 is a flowchart to explain the manufacture of a device (e.g., a semiconductor chip, such as an IC or LSI, an LCD, a CCD, or the like). As an example, a method of manufacturing a semiconductor chip by applying the device manufacturing apparatus described above to an exposure apparatus will be described.

In step S1 (circuit design), the circuit of a semiconductor device is designed. In step S2 (reticle fabrication), a reticle is fabricated on the basis of the designed circuit pattern. In step S3 (wafer manufacture), a wafer is manufactured using a material such as silicon. In step S4 (wafer process), called a pre-process, the device manufacturing apparatus (exposure apparatus) forms an actual circuit on the wafer in accordance with lithography using the reticle and wafer. In step S5 (assembly), called a post-process, a semiconductor chip is formed from the wafer fabricated in step S4. This step includes processes such as assembly (dicing and bonding) and packaging (chip encapsulation). In step S6 (inspection), inspections, such as an operation check test and a durability test, of the semiconductor device fabricated in step S5, are performed. A semiconductor device is finished with these steps and shipped (step S7).

Figure 12:
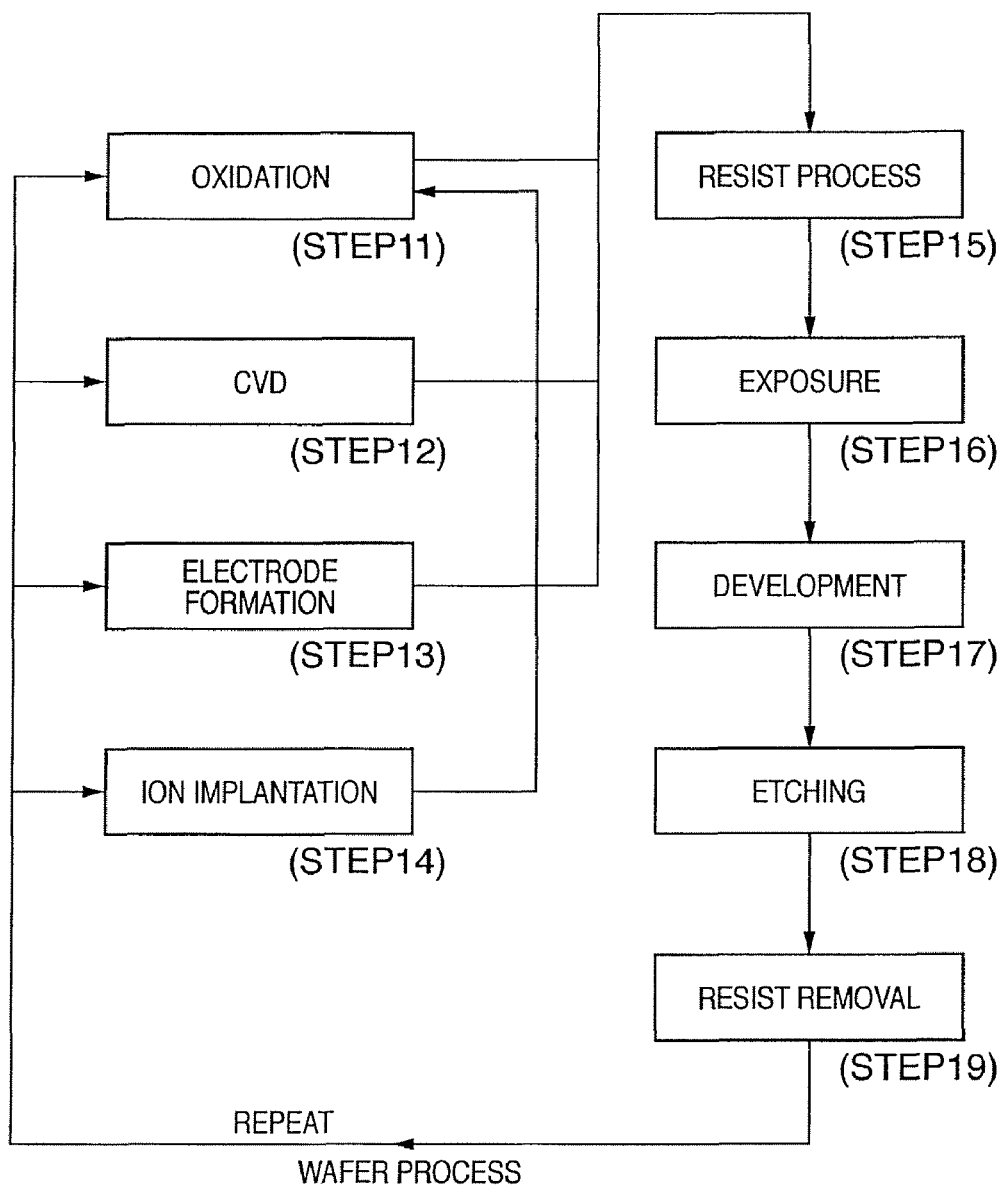
FIG. 12 is a detailed flowchart of the wafer process of FIG. 11.

FIG. 12 is a detailed flowchart of the wafer process of step S4. In step S11 (oxidation), the surface of the wafer is oxidized. In step S12 (CVD), an insulating film is formed on the surface of the wafer. In step S13 (electrode formation), electrodes are formed on the surface of the wafer. In step S14 (ion implantation), ions are implanted in the wafer. In step S15 (resist process), a photosensitive agent is applied to the wafer. In step S16 (exposure), the device manufacturing apparatus (exposure apparatus) transfers the circuit pattern of the reticle onto the photosensitive agent on the wafer to form a latent image pattern on the photosensitive agent. In step S17 (development), the latent image pattern formed on the photosensitive agent on the wafer is developed to form a patterned resist mask. In step S18 (etching), portions other than the developed resist image are removed. In step S19 (resist removal), any unnecessary resist after etching is removed. These steps are repeated to form multiple circuit patterns on the wafer.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A method of conveying an object using a load-lock mechanism, the load-lock mechanism comprising:
   (i) a housing configured to define a volume of a load-lock chamber, the housing including a movable member, a first opening which allows the load-lock chamber to communicate with a processing chamber, and a second opening, which is different from the first opening;
   (ii) a driving mechanism configured to drive the movable member;
   (iii) a first gate valve provided to the first opening;
   (iv) a second gate valve provided to the second opening; and
   (v) a pump configured to reduce a pressure in the load-lock chamber, the method comprising:
   (a) conveying the object into the load-lock chamber through the second gate valve;
   (b) reducing, by the driving mechanism, the volume of the load-lock chamber into which the object has been conveyed, in a state that the second gate valve is opened;

(c) reducing, by the pump, the pressure in the load-lock chamber, the volume of which has been reduced by the driving mechanism, in a state that the second gate valve is closed;

(d) changing, by the driving mechanism, the volume of the load-lock chamber such that the pressure in the load-lock chamber substantially coincides with that in the processing chamber, in a state that the first gate valve and the second gate valve are closed and the load-lock chamber and the processing chamber are spatially separated; and (e) opening the first gate valve in a state that the pressure in the load-lock chamber substantially coincides with that in the processing chamber and conveying the object from the load-lock chamber to the processing chamber.

* * * * *